United States Patent
White

(10) Patent No.: US 6,982,538 B2
(45) Date of Patent: Jan. 3, 2006

(54) METHODS AND APPARATUS FOR GENERATING A SINUSOIDAL MOTOR DRIVE SIGNAL FOR A MEMS GYROSCOPE

(75) Inventor: Stanley A. White, San Clemente, CA (US)

(73) Assignee: Honeywell International Inc., Morristown, NJ (US)

( * ) Notice: Subject to any disclaimer, the term of this patent is extended or adjusted under 35 U.S.C. 154(b) by 523 days.

(21) Appl. No.: 10/236,418

(22) Filed: Sep. 6, 2002

(65) Prior Publication Data

US 2004/0046520 A1 Mar. 11, 2004

(51) Int. Cl.
*H02P 1/46* (2006.01)

(52) U.S. Cl. .......................... 318/702; 318/714; 74/5 R; 74/5.37; 74/5.4; 74/5.5; 74/5.6 D; 74/5.7

(58) Field of Classification Search ................. 318/702, 318/714; 74/5 R, 5.37, 5.4, 5.5, 5.6 D, 5.7
See application file for complete search history.

(56) References Cited

U.S. PATENT DOCUMENTS

| | | | | |
|---|---|---|---|---|
| 3,721,973 A | * | 3/1973 | Sundberg et al. | 318/490 |
| 3,731,213 A | * | 5/1973 | Van Dyke et al. | 318/684 |
| 3,794,894 A | * | 2/1974 | Van Leer | 318/702 |
| 3,829,747 A | * | 8/1974 | Woolfson et al. | 318/702 |
| 4,269,073 A | * | 5/1981 | McIntyre | 74/5.7 |
| 4,651,576 A | * | 3/1987 | Luke | 74/5.46 |
| 5,444,639 A | | 8/1995 | White | |
| 5,539,646 A | * | 7/1996 | Petersen et al. | 701/220 |
| 5,719,571 A | | 2/1998 | Akune et al. | |
| 5,732,002 A | | 3/1998 | Lee et al. | |
| 5,835,544 A | | 11/1998 | Yoshimura et al. | |
| 5,852,524 A | | 12/1998 | Glover et al. | |
| 5,977,737 A | | 11/1999 | Labriola, II | |
| 6,098,046 A | | 8/2000 | Cooper et al. | |
| 6,208,671 B1 | | 3/2001 | Paulos et al. | |
| 6,392,576 B1 | | 5/2002 | Wilson et al. | |
| 6,421,636 B1 | | 7/2002 | Cooper et al. | |
| 2001/0011290 A1 | | 8/2001 | Kovacevic et al. | |

* cited by examiner

*Primary Examiner*—Rina Duda
(74) *Attorney, Agent, or Firm*—Matthew Luxton, Esq.; Armstrong Teasdale LLP

(57) ABSTRACT

An apparatus is described which reduces a time delay and a resultant phase shift in a gyroscope motor drive signal. The motor drive signal originates from a numerically controlled oscillator whose output is sampled at a predetermined rate. The apparatus includes a first element which upsamples the oscillator output signal samples and a band pass filter configured to receive an output from the first element and remove spectral components from the output of the first element. The apparatus further includes a third element which generates a tuning parameter, $\beta'_o$, for tuning of the band pass filter and a scaling multiplier configured to normalize an output of the filter.

26 Claims, 2 Drawing Sheets

METHODS AND APPARATUS FOR GENERATING A SINUSOIDAL MOTOR DRIVE SIGNAL FOR A MEMS GYROSCOPE

BACKGROUND OF THE INVENTION

This invention relates generally to digital signal processing (DSP) and, more specifically, to methods and apparatus for generating motor drive signals for microelectromechanical system (MEMS) gyroscopes.

To provide a motor drive signal for MEMS gyroscopes, a digital sinusoidal signal of frequency $f_o$ is generated by a numerically controlled dual-frequency oscillator (NCDFO). A command input to the oscillator is $\beta_o = \cos(2\pi f_o T)$, where $f_s = 1/T$ is a clock frequency of the oscillator. The frequency $f_o$ varies with changes in $\beta_o$. The digital sinusoidal signal serves as the input to a drive circuit which, in turn, provides an analog signal to a gyroscope drive motor. Because the above described gyroscope motor drive configuration is within a closed-loop control system, the destabilizing effect of time delay, and an attendant phase shift resulting from the time delay, will cause an operational issue to result.

One known attempted solution is to pass the NCDFO output signal through a digital-to-analog converter (DAC), whose output is passed through a low pass, anti-aliasing filter to smooth the analog gyro-drive signal. Unfortunately, the time delay introduced by the combination of these operations is too long to permit solid closed-loop operation. A digital-to-analog-conversion scheme with lower phase shift is clearly needed.

BRIEF SUMMARY OF THE INVENTION

In one aspect, an apparatus to reduce a time delay and a resultant phase shift in a gyroscope motor drive signal is provided. The motor drive signal originates from a numerically controlled oscillator, the oscillator output being sampled at a predetermined rate. The apparatus comprises a first element which upsamples the oscillator output signal samples, a band pass filter configured to receive an output from the first element and remove spectral components from the output of the first element, a third element which generates a tuning parameter, $\beta'_o$, to tune the band pass filter, and a scaling multiplier configured to normalize an output of the filter.

In another aspect, a method for reducing a time delay and a resultant phase shift in a gyroscope motor drive signal which originates from a numerically controlled oscillator is provided. The method comprises placing I-1 zero value samples between each pair of oscillator output samples, filtering spectral components from the combined oscillator output samples and zero value samples, generating a tuning parameter, $\beta'_o$, for use in filtering, and scaling a filter ouput.

In still another aspect, an angular rate measurement system is provided. The system comprises a gyroscope configured to sense an angular rate input and provide a modulated angular rate information signal and a sinusoidal demodulation reference signal. The system also comprises a numerically controlled oscillator (NCO) configured to receive as an input a tuning parameter $\beta$, which is a digitized signal derived from the sinusoidal demodulation reference signal. The NCO is further configured to provide output samples. The system also comprises an automatic gain control (AGC) circuit configured to amplify the output samples of the NCO, an interpolator, and a digital-to-analog converter and filter configured to produce a motor drive signal from an output of the interpolator. The interpolator is configured to place I-1 zero value samples between each pair of amplified output samples, and the interpolator comprises a filter configured to filter spectral components from the combined amplified output samples and zero value samples. The interpolator further generates a tuning parameter, $\beta'_o$, for the filter, and scales the filtered samples to be output from the interpolator.

DETAILED DESCRIPTION OF THE INVENTION

Figure 1:
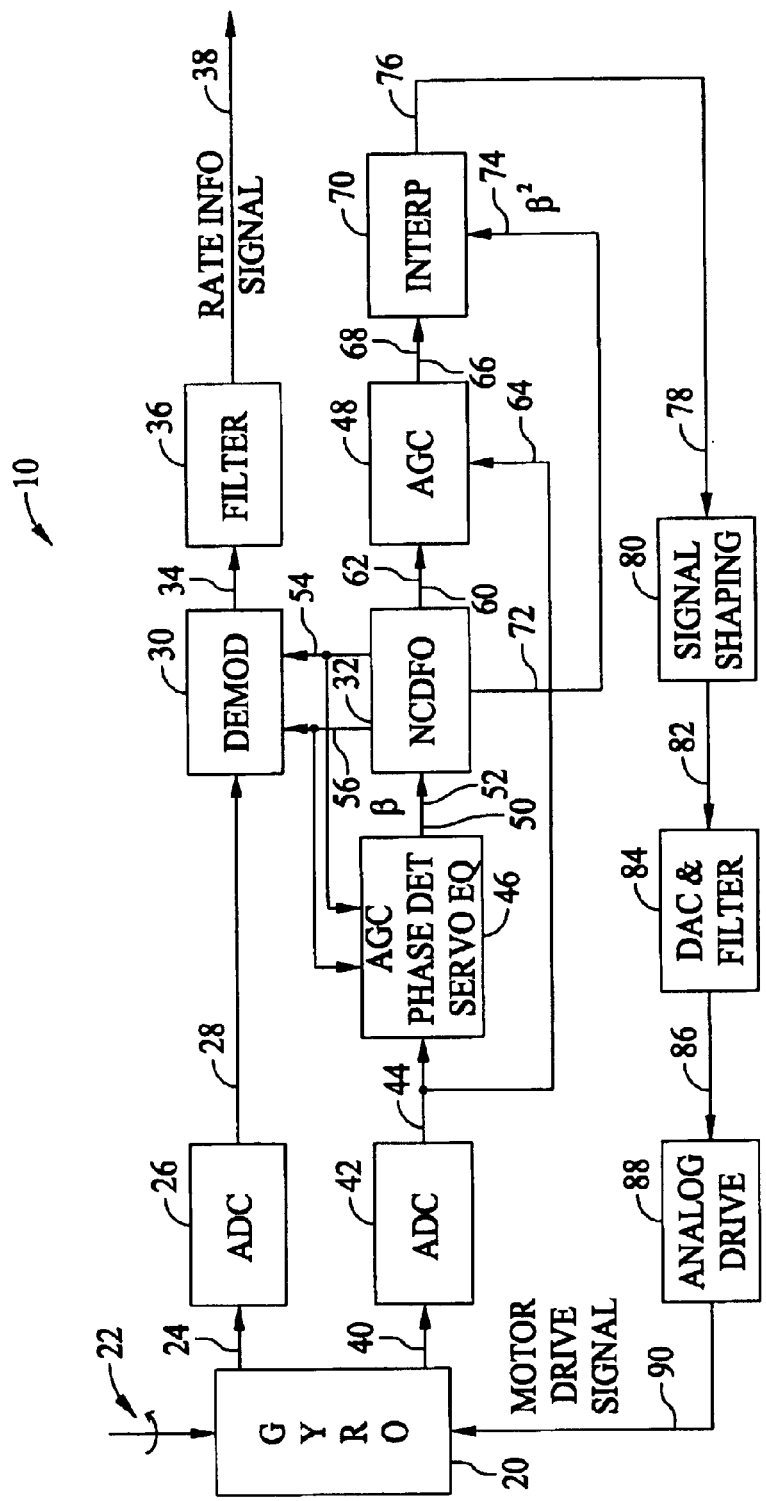
FIG. 1 illustrates a gyroscope angular rate sensing system including an interpolator circuit for reducing a time delay in generating a gyro motor drive signal.

Referring to FIG. 1, an angular rate measurement system 10 as shown is built around gyroscope 20 which senses input angular rate 22. A first output 24 of gyroscope 20 is an electrical signal which is a double side band suppressed carrier (DSSC) modulated representation, at a fundamental frequency $2f_o$, of the input angular rate 22. First output 24 is input to an analog-to-digital conversion (ADC) system 26 including an internal analog anti-alias filter, a sampler, and a digitizer (none shown). An output 28 from ADC system 26 is input to and demodulated by demodulator 30 which, as further described below, receives demodulating signals from numerically controlled dual frequency oscillator (NCDFO) 32. An output 34 from demodulator 30 is filtered with filter 36 whose output 38 is a base band digitized representation of angular input rate 22.

Gyroscope 20 provides a second output 40, which is a sinusoidal demodulation reference signal at a frequency $2f_o$. Second output 40 is connected to a second ADC system 42, functionally identical to ADC system 26. An output 44 from ADC 42 is then input to both a phase detector/servo equalizer 46 and an automatic gain control (AGC) 48. Phase detector/servo equalizer 46 is a combination fast-acting automatic gain control, phase shifter, phase detector, and servo equalizer. An output 50 of phase detector/servo equalizer 46 is a tuning parameter $\beta_o = \cos(2\pi f_o T)$ which determines the frequency of oscillation of NCDFO 32 (NCDFO 32 has a clock rate of 1/T) and is connected to a first input 52 of NCDFO 32. NCDFO 32 provides two outputs 54 and 56 in quadrature at frequency $2f_o$ and another pair of outputs in quadrature at frequency $f_o$. In the embodiment shown, only one output 60 is connected to an input 62 of automatic-gain control (AGC) 48.

As stated above, output signal 44 from ADC 42 is connected to a second input 64 of AGC 48. Output signal 66 from AGC 48 is an amplified version of oscillator output 60, and is automatically adjusted in amplitude until the amplitude of signal 64 reaches a predetermined level. Signal 66 is connected to an input 68 of interpolator 70, which is described in further detail below. Output 72 of NCDFO 32 is the square of tuning parameters $\beta_o$ and is connected to a second input 74 of interpolator 70. Input signal 68 to interpolator 70 is a sinusoid of prescribed amplitude, frequency $f_o$, and sampling frequency $f_s$. Output signal 76 from interpolator 70 is a sinusoid of the same amplitude and frequency as input signal 68, but at a sampling frequency of $I \cdot f_s$, as interpolator 70 increases a sampling rate of input signal 68 by a factor of I. Output signal 76 from interpolator 70 is connected to an input 78 of a signal conditioning element 80, whose output 82 is input to a digital-to-analog converter (DAC) and filter 84. An output 86 of DAC and filter 84 is input to an analog driver 88 which produces a motor-drive signal 90 for gyroscope 20.

Figure 2:
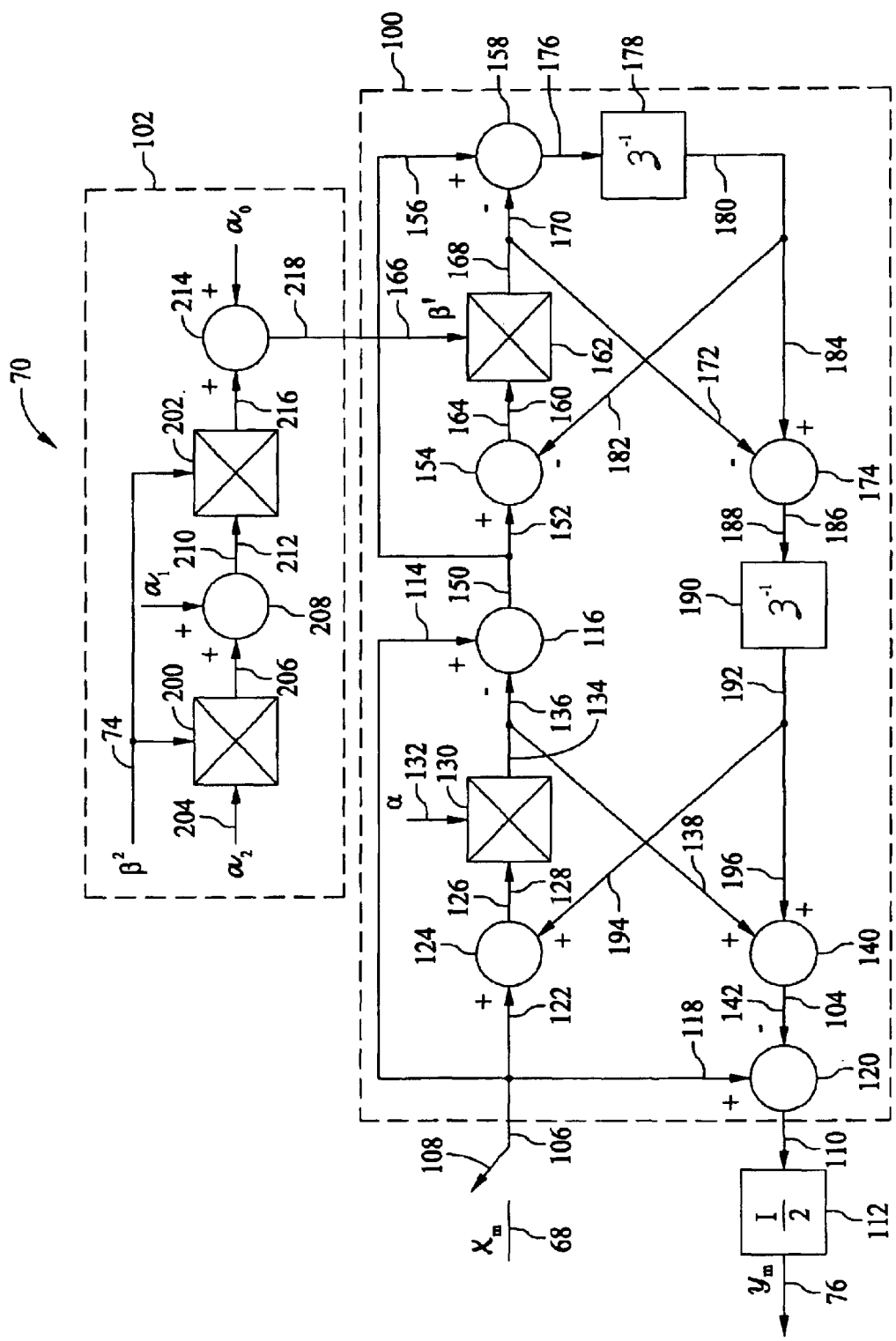
FIG. 2 illustrates an embodiment of an interpolator circuit used in the angular rate sensing system of FIG. 1.

FIG. 2 is a block diagram of interpolator 70 including four elements. A first element upsamples an output signal from oscillator 32 (shown in FIG. 1) by placing I−1 values of zero between each pair of samples from oscillator 32. The upsampled signal drives the second element, a Gray-Markel, lattice-based, second order, band pass interpolation filter, which is clocked at a frequency of I/T to remove all extraneous spectral components of the upsampled signal. As further described below, a passband-width parameter, $\alpha$, in a preferred embodiment, is set to 0.999 and a tuning parameter of the filter is set to $$\beta'_o = \cos(2\pi f_o T/I) = \cos\left[\frac{1}{I}\cos^{-1}(\beta_o)\right].$$

The third element tunes the filter by generating the filter tuning parameter $\beta'_o$, via a three term power series where, $\beta'_o \approx a_0 + a_1\beta_o^2 + a_2\beta_o^4$. The term $\beta_o^2$, is provided by oscillator 32. A fourth element of interpolator 70 is a scaling multiplier which renormalizes the signal amplitude by a factor of I/2.

Referring specifically to FIG. 2, interpolator 70 includes a three-input second-order band pass filter 100 and a power series calculation section 102. In the embodiment shown, band pass filter 100 is a Gray-Markel single-multiplier per order all pass structure whose output 104 is subtracted from an input 106 to provide band pass filtering. Input 106 is delivered to band pass filter 100 by sampling function 108. Output 110 from band pass filter 100 is scaled by I/2 in multiplier 112 to generate output signal 76.

Input 106 is connected to an additive input 114 of a first subtraction element 116, an additive input 118 of a second subtraction element 120, and a first input 122 of a first adder 124. Output 126 of first adder 124 is connected to a first input 128 of a first multiplier 130. A second input 132 to first multiplier 130 is $\alpha$, an externally supplied parameter. In a specific embodiment, $\alpha$ is set to a value of 0.999. An output 134 of first multiplier 130 is connected to a subtractive input 136 of first subtraction element 116 and a first input 138 of second adder 140. Output 104 of second adder 140 is connected to a subtractive input 142 of second subtraction element 120.

Output 150 of first subtraction element 116 is connected to an additive input 152 of third subtraction element 154 and to an additive input 156 of fourth subtraction element 158. A first input 160 of second multiplier 162 is connected to an output 164 of third subtraction element 154. A second input 166 to second multiplier 162 is $\beta'_o$, which is a tuning parameter for band pass filter 100. An output 168 of second multiplier 162 is connected to a subtractive input 170 of third subtraction element 158 and a subtractive input 172 of a fifth subtraction element 174.

An output 176 of fourth subtraction element 158 is connected to a first delay element 178. An output 180 of first delay element 178 is connected to a subtractive input 182 of third subtraction element 154 and to an additive input 184 of fifth subtraction element 174. An output 186 of fifth subtraction element 174 is connected to an input 188 of second delay element 190. Output 192 of second delay element 190 is connected to a second input 194 of first adder 124 and a second input 196 of second adder 140.

In operation, a sinusoid, at a frequency $f_o$, is provided at input 68 at a sampling frequency of $f_s$, to sampling function 108. The sinusoid at input 68 is modified at sampling function 108 by insertion of I−1 values of zero being input between each pair of input samples of the sinusoid. A new signal is created at a sampling rate of I·$f_s$. As described above, band pass filter 100 has as its second input 132 the parameter $\alpha$, that determines a bandwidth for band pass filter 100. The bandwidth parameter, $\alpha$, has, in one embodiment, a nominal value of 0.999, where $\alpha$ is determined as $\alpha$=tan ($\pi f_{BW}T/I$), and where $f_{BW}$ is the 3 dB bandwidth (in Hz) of the pass band. A center of the pass band is tuned by input 166, the parameter $\beta'_o$, where $$\beta'_o = \cos(2\pi f_o T/I) = \cos\left[\frac{1}{I}\cos^{-1}(\beta_o)\right],$$

where $\beta_o$ is the input to NCDFO 32.

Direct calculation of $\beta'_o$, from $\beta_o$ is difficult, but a Chebychev approximation can be obtained, in one embodiment, by a three-term power series, for example, $\beta'_o \approx a_0 + a_1\beta_o^2 + a_2\beta_o^4$. This power series is mechanized in power series calculation section 102 whose input 74, $\beta_0^2$, is obtained directly from NCDFO 32. Input 74 is connected as a first input to third multiplier 200 and fourth multiplier 202. A second input 204 of third multiplier 200 is coefficient $a_2$. An output 206 of third multiplier 200 is summed with coefficient $a_1$, in third adder 208, whose output 210 is connected to a second input 212 of fourth multiplier 202. Fourth adder 214 sums an output 216 of multiplier 202 with coefficient $a_0$. An output 218 of adder 214 is the tuning parameter $\beta'_o$. In one embodiment, $a_0$, $a_1$, and $a_2$, are computed utilizing a Chebychev approximation program as illustrated in Appendix A. In a specific embodiment, and as outlined in Appendix A, $a_0$ is 0.9967032511, $a_1$ is 0.00526891, and $a_2$ is −0.0021640344.

Numerically controlled, dual frequency oscillators (NCDFO) implemented in MEMS gyroscope motor drive systems, typically produce a sinusoid, whose frequency may not be constant, and which is sparsely sampled. Such a motor drive system can introduce an unacceptable amount of time delay and phase shift, as above described. One way to improve performance of such motor drive systems is to increase the sampling frequency of the NCDFO output signal through the use of interpolator 70. Implementation of system 10, including interpolator 70 allows an increase in the sampling frequency of the NCDFO output signal by a factor of I, where I is greater than one, and typically eight or more. The combined time delay of interpolator 70, a higher frequency DAC, and a simple low pass, anti-aliasing filter (DAC and filter 84) is less than the time delays in known gyroscope motor drive systems.

While the invention has been described in terms of various specific embodiments, those skilled in the art will recognize that the invention can be practiced with modification within the spirit and scope of the claims.

What is claimed is:

1. An apparatus to reduce a time delay and a resultant phase shift in a gyroscope motor drive signal, the motor drive signal originating from a numerically controlled oscillator having an output, the oscillator output being sampled at a predetermined rate, said apparatus comprising:

a first element which upsamples the oscillator output samples;

a band pass filter configured to receive an output from said first element and remove spectral components of the output of said first element;

a third element which generates a tuning parameter, $\beta'_o$, to tune said band pass filter, and a scaling multiplier configured to normalize an output of said filter.

2. An apparatus according to claim 1 wherein said first element is configured to upsample the oscillator output by a factor of I by placing I−1 values of zero samples between each pair of samples received from the oscillator, where I is an integer.

3. An apparatus according to claim 1 wherein I is an integer greater than one.

4. An apparatus according to claim 1 wherein I is an integer from eight to sixteen.

5. An apparatus according to claim 1 wherein said band pass filter comprises a Gray-Markel lattice-based, second order band pass interpolation filter, clocked at a frequency of I/T, where 1/T is a clock rate of the oscillator, and I is an integer.

6. An apparatus according to claim 5 wherein said band pass filter comprises an input parameter α, for determining a bandwidth for said band pass filter, where α has a nominal value of 0.999.

7. An apparatus according to claim 5 wherein said band pass filter comprises an input parameter α which is determined as $\alpha=\tan(\pi f_{BW}T/I)$, and where $f_{BW}$ is a 3 dB bandwidth (in Hz) of the pass band, 1/T is a clock rate of the oscillator, and I is an integer.

8. An apparatus according to claim 5 wherein a tuning parameter for the pass band of said filter is $$\beta'_o = \cos(2\pi f_o T/I) = \cos\left[\frac{1}{I}\cos^{-1}(\beta_o)\right],$$

where $\beta_o$ is an input to the oscillator, 1/T is a clock rate of the oscillator, I is an integer, and $f_0$ is a fundamental frequency.

9. An apparatus according to claim 1 wherein the tuning parameter, $\beta'_o$, is set to $\beta'_o \approx \alpha_0 + \alpha_1 \beta_o^2 + \alpha_2 \beta_o^4$, where the term $\beta_0^2$, is provided by the oscillator, and $\alpha_0$, $\alpha_1$, and $\alpha_2$ are calculated coefficients.

10. An apparatus according to claim 1 wherein said scaling multiplier has a value of I/2, where I is an integer.

11. A method for reducing a time delay and a resultant phase shift in a gyroscope motor drive signal which originates from a numerically controlled oscillator, said method comprising:
   placing I−1 zero value samples between each pair of oscillator output samples, I being an integer;
   filtering spectral components from the combined oscillator output samples and zero value samples;
   generating a tuning parameter, $\beta'_o$, for said filtering; and
   scaling an output of said filtering.

12. A method according to claim 11 wherein I is an integer greater than one.

13. A method according to claim 11 wherein I is an integer from eight to sixteen.

14. A method according to claim 11 wherein said filtering comprises filtering with a Gray-Markel lattice-based, second order band pass interpolation filter, clocked at a frequency of I/T, where 1/T is a clock rate of the oscillator, and I is an integer.

15. A method according to claim 14 further comprising:
   providing an input parameter, α, to the filter which has a nominal value of 0.999; and
   determining a bandwidth for the band pass filter using the input parameter.

16. A method according to claim 14 further comprising providing an input parameter, α, to the filter which is determined as $\alpha=\tan(\pi f_{BW}T/I)$, and where $f_{BW}$ is a 3 dB bandwidth (in Hz) of the pass band, 1/T is a clock rate of the oscillator, and I is an integer.

17. A method according to claim 14 further comprising providing a tuning parameter for the pass band of the band pass filter, the tuning parameter calculated as $$\beta'_o = \cos(2\pi f_o T/I) = \cos\left[\frac{1}{I}\cos^{-1}(\beta_o)\right],$$

where $\beta_o$ is an input to the oscillator, and $f_0$ is a fundamental frequency, 1/T is a clock rate of the oscillator, and I is an integer.

18. A method according to claim 14 further comprising determining the tuning parameter, $\beta'_o$, using a power series, where $\beta'_o \approx \alpha_0 + \alpha_1 \beta_o^2 + \alpha_2 \beta_o^4$, where the term $\beta_0^2$, is provided by the oscillator, and $\alpha_0$, $\alpha_1$, and $\alpha_2$ are calculated coefficients.

19. A method according to claim 11 wherein said scaling an output of said filtering comprises providing a scaling multiplier with a value of I/2, where I is an integer.

20. An angular rate measurement system comprising:
   a gyroscope configured to sense an angular rate input and provide a modulated angular rate information signal and a sinusoidal demodulation reference signal;
   a numerically controlled oscillator (NCO) configured to receive as an input a tuning parameter β, which is a digitized signal derived from the sinusoidal demodulation reference signal, said oscillator further configured to provide output samples;
   an automatic gain control (AGC) circuit configured to amplify the output samples of said NCO;
   an interpolator configured to place I−1 zero value samples between each pair of amplified output samples, said interpolator comprising a filter configured to filter extraneous spectral components from the combined amplified output samples and zero value samples, generate a tuning parameter, $\beta'_o$, for said filter, and scale the filtered samples to be output from said interpolator, where I is an integer; and
   a digital-to-analog converter and filter, said converter and filter configured to produce a motor drive signal from an output of said interpolator.

21. An angular rate measurement system according to claim 20 wherein I is an integer ranging from eight to sixteen.

22. An angular rate measurement system according to claim 20 wherein said interpolator comprises a Gray-Markel lattice-based, second order band pass interpolation filter, clocked at a frequency of I/T, where 1/T is a clock rate of said NCO and I is an integer.

23. An angular rate measurement system according to claim 20 wherein an input parameter to said interpolator, α, is determined according to $\alpha=\tan(\pi f_{BW}T/I)$, and where $f_{BW}$ is a 3 dB bandwidth (in Hz) of a pass band for said filter, where 1/T is a clock rate of said NCO, 1/T is a clock rate of the oscillator, and I is an integer.

24. An angular rate measurement system according to claim 20 wherein a tuning parameter for a pass band for said filter is calculated as $$\beta'_o = \cos(2\pi f_o T/I) = \cos\left[\frac{1}{I}\cos^{-1}(\beta_o)\right],$$

where $\beta_o$ is an input to said NCO, $f_0$ is a fundamental frequency, 1/T is a clock rate of the oscillator, and I is an integer.

25. An angular rate measurement system according to claim 20 wherein said interpolator is configured to approximate a tuning parameter, $\beta'_o$, for said filter using a power series, where $\beta'_o \approx \alpha_0 + \alpha_1 \beta_o^2 + \alpha_2 \beta_o^4$, where the term $\beta_0^2$, is provided by said oscillator, and $\alpha_0$, $\alpha_1$, and $\alpha_2$ are calculated coefficients.

26. An angular rate measurement system according to claim 25 wherein $\alpha_0$ is 0.9967032511, $\alpha_1$ is 0.00526891, and $\alpha_2$ is −0.0021640344.

* * * * *

UNITED STATES PATENT AND TRADEMARK OFFICE
CERTIFICATE OF CORRECTION

PATENT NO. : 6,982,538 B2
DATED : January 3, 2006
INVENTOR(S) : Stanley A. White It is certified that error appears in the above-identified patent and that said Letters Patent is hereby corrected as shown below:

Column 1,
Line 53, delete "ouput" and insert -- output --.
Lines 59, 62 and 65, replace "NCO" with -- NCDFO --.
Line 59, between "controlled" and "oscillator" insert -- dual-frequency --.

Column 2,
Line 58, delete "parameters" and insert -- parameter --.

Column 4,
Line 15, after "$\beta_0$" delete ",".
Line 65, after "filter" delete ",".

Column 5,
Line 19, after "parameter" delete "a" and insert -- $\alpha$ --.
Lines 14 and 34, delete "$\alpha_0$, $\alpha_1$ and $\alpha_2$" and insert -- $a_0$, $a_1$ and $a_2$ --.
Line 33, delete "$\alpha_0 + \alpha_1\beta_0^2 + \alpha_2\beta_0^4$" and insert -- $a_0 + a_1\beta_0^2 + a_2\beta_0^4$ --.

Column 6,
Line 13, delete "$\alpha_0 + \alpha_1\beta_0^2 + \alpha_2\beta_0^4$" and insert -- $a_0 + a_1\beta_0^2 + a_2\beta_0^4$ --.
Line 23, between "controlled" and "oscillator" insert -- dual-frequency --.
Lines 23, 29, 54 and 63, replace "NCO" with -- NCDFO --.

Column 7,
Line 2, delete "$\alpha_0 + \alpha_1\beta_0^2 + \alpha_2\beta_0^4$" and insert -- $a_0 + a_1\beta_0^2 + a_2\beta_0^4$ --.
Line 3, delete "$\alpha_0$, $\alpha_1$ and $\alpha_2$" and insert -- $a_0$, $a_1$ and $a_2$ --.

UNITED STATES PATENT AND TRADEMARK OFFICE
CERTIFICATE OF CORRECTION

PATENT NO. : 6,982,538 B2
DATED : January 3, 2006
INVENTOR(S) : Stanley A. White It is certified that error appears in the above-identified patent and that said Letters Patent is hereby corrected as shown below:

Column 8,
Line 2, delete "$\alpha_0$" and insert -- $a_0$ --; delete "$\alpha_1$" and insert -- $a_1$ --; delete "$\alpha_2$" and Insert -- $a_2$ --.

Signed and Sealed this

Fourteenth Day of March, 2006

JON W. DUDAS
*Director of the United States Patent and Trademark Office*